United States Patent [19]

Cline

[11] Patent Number: 5,714,890
[45] Date of Patent: Feb. 3, 1998

[54] PROGRAMMABLE LOGIC DEVICE WITH FIXED AND PROGRAMMABLE MEMORY

[75] Inventor: Ronald L. Cline, Albuquerque, N. Mex.

[73] Assignee: Philips Electronics North America Corporation, New York, N.Y.

[21] Appl. No.: 789,095

[22] Filed: Oct. 11, 1996

Related U.S. Application Data

[63] Continuation of Ser. No. 584,997, Jan. 11, 1996, abandoned, which is a continuation of Ser. No. 311,793, Sep. 26, 1994, abandoned.

[51] Int. Cl.$^6$ ............................................. H03K 19/177
[52] U.S. Cl. ................................................. 326/40; 326/41
[58] Field of Search ................................. 326/38, 39, 41, 326/40

[56] References Cited

U.S. PATENT DOCUMENTS

| | | | |
|---|---|---|---|
| 4,422,072 | 12/1983 | Cavlan | 326/38 |
| 4,758,746 | 7/1988 | Birkner et al. | 326/38 |
| 4,942,319 | 7/1990 | Pickett et al. | 326/38 |
| 5,189,320 | 2/1993 | Gongwer | 326/41 |
| 5,235,221 | 8/1993 | Douglas et al. | 326/38 |
| 5,260,610 | 11/1993 | Pedersen et al. | 326/41 |

OTHER PUBLICATIONS

Weste et al.; "Principles of CMOS VLSI Design, A Systems Perspective"; © 1985 by AT&T Bell Laboratories, Inc. and Kamran Eshraghian; pp. 180-183.

*Primary Examiner*—Edward P. Westin
*Assistant Examiner*—Benjamin D. Driscoll
*Attorney, Agent, or Firm*—Steven R. Biren

[57] ABSTRACT

An improved programmable logic device (PLD) comprises a programmable AND first array to which a set of PLD input lines are selectively connectable and providing a set of outputs which are selectively connectable to a set of inputs to a programmable OR second array which drives a second set of output lines, in combination with a programmable AND third array having a set of inputs that are selectively connectable to the set of input lines and having a set of outputs that are fixedly connected as a set of inputs to a fixed OR fourth array providing a set of PLD outputs, with the set of outputs from the OR second array also connected in a fixed manner as inputs to the OR fourth array. This arrangement overcomes some of the weaknesses in both the conventional PAL and PLA architectures while retaining most of their strengths.

8 Claims, 2 Drawing Sheets

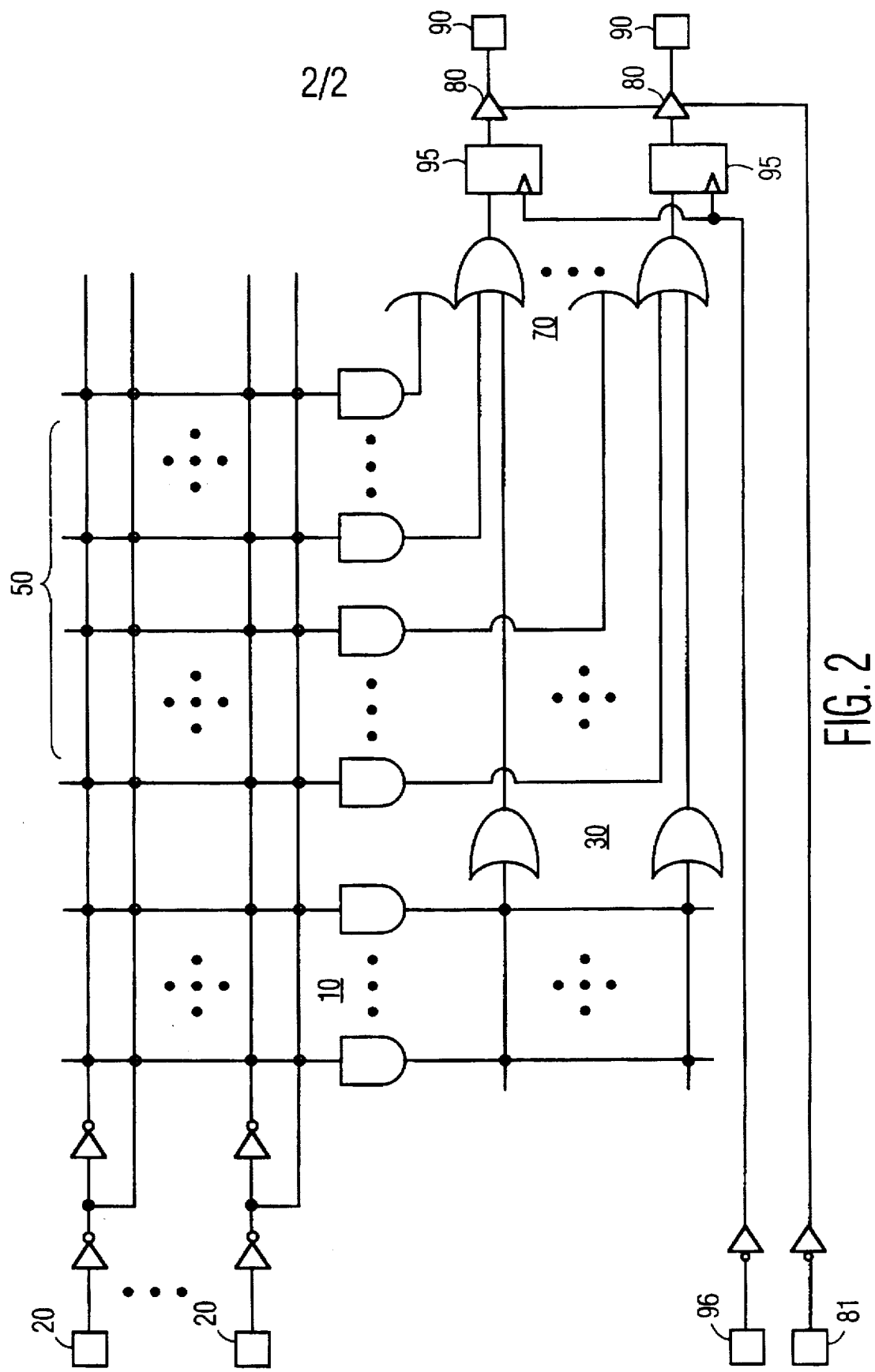

5,714,890

PROGRAMMABLE LOGIC DEVICE WITH FIXED AND PROGRAMMABLE MEMORY

This is a continuation of application Ser. No. 08/584,997, filed Jan. 11, 1996, abandoned which is a continuation of Ser. No. 08/311,793 filed Sep. 26, 1994, abandoned.

BACKGROUND OF THE INVENTION programable logic devices (PLD), sometimes known as field-programmable logic array circuits, are well known and widely used in the field of semiconductor digital integrated circuits. A PLD generally comprises a programmable matrix or array made up of a first array of AND gates whose outputs are selectively connectable to a second array of OR gates. A plurality of input lines are provided to the AND array, and a plurality of output lines are fed by the OR array. Two popular commercial embodiments are known as programmable Array Logic (PAL) and programmable Logic Array (PLA). See the detailed description of such kinds of devices in U.S. Pat. No. 4,124,899 which describes the PAL type of PLDs, and U.S. Pat. Nos. 4,422,072 and 4,703,206 which describe in detail the PLA type of PLDs. Since the description in these patents are so detailed and complete, it is unnecessary to repeat those details here, and the full contents of those three patents are herewith incorporated by reference.

For purposes of the present invention, it is only necessary to briefly point out that the PAL type is characterized by a programmable AND array and a fixed or non-programmable OR array, and the PLA type of PLD is characterized by a programmable AND array and a programmable OR array.

It turns out that the PLA architecture has certain advantages and disadvantages when used to implement certain kinds of logic circuits, and the PAL architecture has certain advantages and disadvantages when used to implement other kinds of logic circuits. Reference is also made to the aforementioned patents for a further description of problems and solutions of their respective architectures.

SUMMARY OF THE INVENTION

An object of the invention is an improved PLD architecture.

A further object of the invention is a PLD architecture that combines the best features of the PLA and PAL types of architectures in a single device.

According to one aspect of the invention, the improved PLD of the invention comprises a programmable AND first array to which a first set of PLD input lines are selectively connectable and providing a first set of outputs which are selectively connectable to a second set of inputs to a programmable OR second array which drives a second set of output lines, in combination with a programmable AND third array having a third set of inputs that are selectively connectable to the first set of input lines and having a third set of outputs that are fixedly connected as a fourth set of inputs to a fixed OR fourth array providing a fourth set of PLD outputs, with the second set of outputs from the OR second array also connected in a fixed manner as inputs to the OR fourth array. In brief, this arrangement overcomes some of the weaknesses in both the conventional PAL and PLA architectures while retaining most of their strengths.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters in the various figures designating the same or similar components.

BRIEF DESCRIPTION OF THE DRAWINGS

In the drawings:

FIG. 2 is a schematic diagram of another form of PLD circuit in accordance with the invention.

DETAILED DESCRIPTION OF THE PREFERRED EMBODIMENTS

Figure 1:
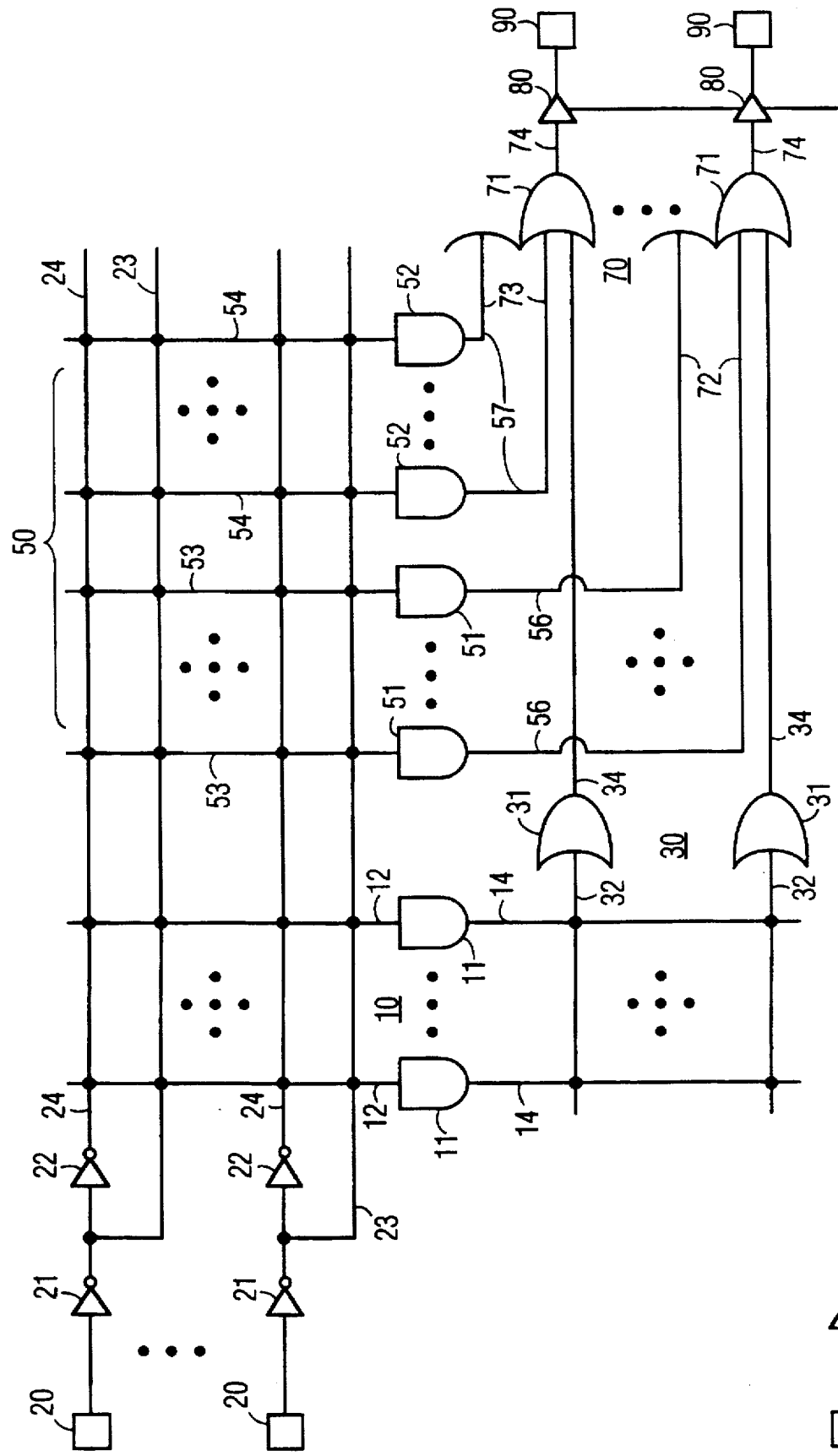
FIG. 1 is a schematic diagram of one form of PLD circuit in accordance with the invention.

As is well known, a PLD comprises an array of logical AND and OR gates that can be programmed for a specific function, and each output function is the sum (logical OR) of selected products (logical ANDs) where each product is the product of selected polarities of selected inputs. The PLD can be programmed so that any input line can be connected to any AND input gate and any of the products (ANDs) can be summed by any of the OR gates. Programming is typically accomplished by blowing or not blowing fusible links connecting the conductors of the two arrays. Given enough products, often referred to for convenience as p-terms, the sum of the products can express all boolean transfer functions. While these known principles have been explained in terms of AND and OR gate arrays, as is well known in the art, logical NAND and NOR gates may be utilized in conjunction with or as substitutes for the AND and OR gates, respectively.

The main problems with the prior art PLDs are as follows. With an architecture made up of the PLA type only, when dealing with p-terms that are unique to one output, the PLA-only architectures are slow and array-inefficient, in that too many gates are needed to implement the desired logic circuit. On the other hand, when there exist common p-terms between outputs, the PAL-only architectures are array inefficient, and when more p-terms than are available are required for a particular output, then the PAL-only architectures are slow in performance. The PLD of the invention exhibits the best features of each of these previously-known types of architectures while optimizing array utilization and performance.

FIG. 1 shows a circuit diagram of one form of PLD architecture of the invention. It comprises a programmable AND first array 10 comprised of a plurality (M) of AND gates 11, each of which has a plurality of inputs represented by the single line input 12. A plurality (N) of PLD input lines 20 are provided, each connected in series with two inverters 21, 22 whose respective outputs 23, 24 provide opposite polarity (high or low; "1"or "0"signals of the signal input at that line 20. As will be observed, each dual line 23, 24 is connectable to an input line 12 of each gate 11. This connectability is represented by the circle at each intersection of the lines. Thus, if, say, 4 of the input lines had high or low polarity outputs connected to the single input line 12 of a gate 11, in reality it means that 4 separate inputs exist to that one gate, and in accordance with the usual truth tables, the gate output depends on the respective low and high inputs to that gate. This same symbology is used for the inputs to the other AND and OR gates shown.

The gates 11 provide a first set of outputs 14 which are selectively connectable to a second set of inputs 32 to a programmable OR second array 30 comprising (O) OR gates 31 which drive a second set of output lines 34. The circuit further comprises a programmable AND third array 50 comprising a plurality (p) of sets of (Q) AND gates 51, 52 having a third set of respective inputs 53, 54 that are selectively connectable to the first set of input lines 20 and having a third set of respective outputs 56, 57 that are fixedly connected (non-programmable) as a fourth set of respective inputs 72, 73 to a fixed OR fourth array 70 comprising a plurality (R) of OR gates 71 providing a fourth set of outputs 74. Connected to each of the outputs 74 is a controllable buffer 80 whose control inputs are accessible via a further PLD input 81. Thus the outputs of the PLD at terminals 90 can be selectively controlled via the input 81.

The second set of outputs 34 from the OR second array 30 is also connected in a fixed (non-programmable) manner as inputs to the OR fourth array 70. Also, each AND gate of a set 51, 52 has a respective output 72, 73 connectable to the same gate 71 of the fourth OR array 70. For simplicity, the additional inputs are indicated by the curved extension at the front of the OR gate symbol.

As is common in this art as explained above, the small circles at the intersections represent fusible links that can be blown or left alone to provide the desired set of connections to implement a particular logic circuit. It will thus be clear that the first 10 and third 50 arrays made up of AND gates are programmable, and that the third 30 array made up of OR gates is also programmable, but that the fourth 70 array of OR gates is fixed or non-programmable.

Typically, as examples for the PLD illustrated in FIG. 1, there can be provided N inputs=8–48 for a first array 10 comprising M=8–64 AND gates 11, a second array 30 comprising O=8–32 OR gates 31, a third array 50 comprising P=8–32 sets of Q=4–16 AND gates 51, 52 each, and a fourth array 70 of R=8–32 OR gates 71 feeding R outputs 90. The invention is not limited to these typical numbers of components and other numbers of components are considered within the scope of the invention.

The process or technology by which the PLD of the invention is made is not important and any of the standard bipolar, NMOS or CMOS processes can be used. Also, it will be clear from the foregoing that the number of array elements, i.e., the array size, in any of the four arrays can be varied without departing from the principles described herein. It will also be clear that the heretofore described "fuse-link" system may be implemented in any of the other well known technologies, including electrically-erasable floating gate memory elements.

It will also be clear that macro cells, such as are described in the referenced patents, including EX-ORs and other well known macro cells, can also be added without departing from the scope of the invention. FIG. 2 shows a circuit similar to that of FIG. 1 in which flip-flops 95, as macro cells, are added to the PLD of the invention, with an additional control line 96 provided to drive the flip-flops, as is described in the referenced patents.

The main advantages of the invention are that it can handle faster and more array-efficiently logic functions using p-terms which are unique to one output, compared to PLA-only implementations, since the second array can effectively be bypassed in the signal path.

Also, when common p-terms between outputs exist, again they are handled in a more array-efficient manner because only one p-term is needed, which can be shared among all relevant outputs. Performance is improved because the power dissipation required for the previous (PAL-only) multiple p-term implementation can be reallocated among the remaining, reduced number of, p-terms.

And, when more p-terms than are available are required for a particular output, performance will be faster because additional outputs are not necessary to help form the required partial products, as would be required in a PAL-only implementation.

While the invention has been described in connection with preferred embodiments, it will be understood that modifications thereof within the principles outlined above will be evident to those saddled in the art and thus the invention is not limited to the preferred embodiments but is intended to encompass such modifications.

What is claimed is:

1. A programmable logic device comprising:
    (a) a programmable AND first array,
    (b) a set of PLD input lines selectively connectable as first inputs to the AND first array,
    (c) said AND first array having a set of first outputs,
    (d) a programmable OR second array having a set of second inputs selectively connectable to the set of first outputs and having a set of second outputs,
    (e) a programmable AND third array having a set of third inputs that are selectively connectable to the set of first inputs and having a set of third outputs,
    (f) a fixed OR fourth array providing a set of fourth outputs and having a set of fourth inputs fixedly connected to both the second and third outputs,
    (g) a set of PLD output lines connected to the fourth outputs.

2. The programmable logic device of claim 1, wherein said set of PLD input lines comprises dual polarity lines.

3. The programmable logic device of claim 1, further comprising controllable buffers connected between the fourth outputs and the PLD output lines.

4. The programmable logic device of claim 1, further comprising macro circuits connected between the fourth outputs and the PLD output lines.

5. The programmable logic device of claim 4, wherein the macro circuits comprise flip-flops.

6. A programmable logic device comprising:
    (a) a programmable AND first array comprising M gates,
    (b) a set of N PLD input lines selectively connectable as first inputs to the AND first array,
    (c) said AND first array having a set of first outputs,
    (d) a programmable OR second array comprising O gates and having a set of second inputs selectively connectable to the set of first outputs and having a set of second outputs,
    (e) a programmable AND third array comprising p sets of Q gates each and having a set of third inputs that are selectively connectable to the set of first inputs and having a set of third outputs,
    (f) a fixed OR fourth array comprising R gates providing a set of fourth outputs and having a set of fourth inputs fixedly connected to both the second and third outputs,
    (g) a set of PLD output lines connected to the fourth outputs.

7. The programmable logic device of claim 6, wherein each of the outputs of the Q gates of a set are connected to the same OR gate of the fourth array.

8. The programmable logic device of claim 7, wherein:
    M varies between 8–64,
    N varies between 8–48,
    O varies between 8–32,
    p varies between 8–32,
    Q varies between 4–16,
    R varies between 8–32.

* * * * *